United States Patent
Moriyasu et al.

(10) Patent No.: US 10,896,737 B2
(45) Date of Patent: Jan. 19, 2021

(54) SEMICONDUCTOR DEVICE

(71) Applicant: RENESAS ELECTRONICS CORPORATION, Tokyo (JP)

(72) Inventors: Takanori Moriyasu, Tokyo (JP); Kazuo Yoshihara, Tokyo (JP); Akihiko Kanda, Tokyo (JP); Yoshihiko Asai, Tokyo (JP); Tomoya Ogawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/576,442

(22) Filed: Sep. 19, 2019

(65) Prior Publication Data
US 2020/0135285 A1    Apr. 30, 2020

(30) Foreign Application Priority Data

Oct. 29, 2018    (JP) .................................. 2018-202741

(51) Int. Cl.
| | |
|---|---|
| G11C 16/04 | (2006.01) |
| G11C 16/34 | (2006.01) |
| G11C 16/02 | (2006.01) |
| G11C 16/06 | (2006.01) |
| G11C 16/10 | (2006.01) |
| G11C 7/00 | (2006.01) |
| G11C 7/10 | (2006.01) |
| G11C 16/26 | (2006.01) |
| G11C 13/00 | (2006.01) |

(52) U.S. Cl.
CPC ........ *G11C 16/3459* (2013.01); *G11C 7/1045* (2013.01); *G11C 16/0483* (2013.01); *G11C 13/0069* (2013.01); *G11C 16/04* (2013.01); *G11C 16/26* (2013.01)

(58) Field of Classification Search
CPC .............. G11C 16/3459; G11C 7/1045; G11C 16/0483
USPC ...................................... 365/185.22
See application file for complete search history.

(56) References Cited

U.S. PATENT DOCUMENTS

| | | | |
|---|---|---|---|
| 5,487,036 A | * | 1/1996 | Akaogi .................. G11C 29/04 365/189.09 |
| 6,091,640 A | | 7/2000 | Kawahara et al. |

(Continued)

FOREIGN PATENT DOCUMENTS

JP    10-106276 A    4/1998

*Primary Examiner* — Ly D Pham
(74) *Attorney, Agent, or Firm* — McDermott Will & Emery LLP

(57) ABSTRACT

An object of the present invention is to increase a writing speed to a flash memory while suppressing an increase in noise. In the high-speed write mode, the memory controller simultaneously performs a first write operation with a second write current having a current value smaller than the first write current with respect to a second number of memory cells having a larger number than the first write current. At the completion of the first write operation, the memory controller simultaneously performs the second write operation by the third write current having a larger current value than the second write current with respect to the memory cell determined by the sense amplifier to have not completed the write operation in the determination process.

18 Claims, 14 Drawing Sheets

(56) References Cited

U.S. PATENT DOCUMENTS

| | | | |
|---|---|---|---|
| 2005/0024974 A1* | 2/2005 | Noguchi | G11C 7/22 |
| | | | 365/230.03 |
| 2012/0230085 A1* | 9/2012 | Kawai | H04L 45/08 |
| | | | 365/148 |
| 2018/0033483 A1* | 2/2018 | Bertin | G11C 13/0002 |
| 2019/0341107 A1* | 11/2019 | Bertin | B82Y 10/00 |

* cited by examiner

FIG. 4

|       | Vd   | Vcg | Vmg  | Vs |
|-------|------|-----|------|----|
| Write | 0.5V | 1V  | 10V  | 5V |
| Erase | 0V   | 0V  | -10V | 5V |
| Read  | 1V   | 1V  | 0V   | 0V |

FIG. 8

| | Number of Pulse Applications | Current Value | Number of Memory Cells | CP Capability | Write Speed |
|---|---|---|---|---|---|
| Normal write operation | All | 1 | 1 | 1 | ×1 |
| High-speed write operation | 1~N1 | 0.5 | 2 | 1 | ×2 |
| | N1+1~ | 1 | <<0.01 | 0.01 | |

FIG. 10

| | Number of Pulse Applications | Current Value | Number of Memory Cells | CP Capability | Write Speed |
|---|---|---|---|---|---|
| Normal Write Mode | All | 1 | 1 | 1 | ×1 |
| Low Noise Write Mode (1) — Third Write Operation | 1~N2 | 0.5 | 1 | 0.5 | ×1 |
| Low Noise Write Mode (1) — Fourth Write Operation | N2+1~ | 1 | <<0.01 | 0.01 | |
| Low Noise Write Mode (2) — Third Write Operation | 1~N2 | 0.5 | 0.5 | 0.25 | ×0.5 |
| Low Noise Write Mode (2) — Fourth Write Operation | N2+1~ | 1 | <<0.01 | 0.01 | |

FIG. 13

| Pulse | Threshold voltage | Verification result |
|-------|-------------------|---------------------|
| P1    | V1                | Pass                |
| P1    | V2                | Pass                |
| P1    | V3                | Fail                |
| P2    | V3                | Fail                |
| P3    | V3                | Pass                |
| P3    | V4                | Pass                |
| P3    | PV                | Pass                |

# SEMICONDUCTOR DEVICE

CROSS-REFERENCE TO RELATED APPLICATIONS

The disclosure of Japanese Patent Application No. 2018-202741 filed on Oct. 29, 2018 including the specification, drawings and abstract is incorporated herein by reference in its entirety.

BACKGROUND

The present invention relates to a semiconductor device.

For example, non-volatile memories such as CPUs (Central Processing Unit) and flash memories are mounted on semiconductor devices for use in automobiles. In recent years, in-vehicle semiconductors, various functions such as OTA (Over The Air) and the like have been mounted, and higher functions have been developed. Along with this, the amount of code and the amount of data increase, so that the capacity of the flash memory increases.

However, as the capacity of the flash memory increases, the test time increases and the test cost increases. Therefore, for example, Japanese JP10-106276 Laid-Open Publication (Reference 1) discloses a semiconductor integrated circuit or the like for speeding up a writing operation to a nonvolatile memory cell.

Specifically, the flash memory of Reference 1 applies a pulsed voltage to the nonvolatile memory cell until the threshold voltage of the nonvolatile memory cell having the first threshold voltage is changed to the second threshold voltage. The flash memory has, as a write mode, a first write mode (coarse write) in which the amount of change in the threshold voltage of the nonvolatile memory cell, which is changed every time the pulse voltage is applied, is relatively increased, and a second write mode (high-precision write) in which the amount of change in the threshold voltage is relatively decreased. The number of pulses required to change the threshold voltage of the memory cell is less in the coarse write mode. For this reason, the number of verify operations when the coarse write mode is used is smaller, thereby speeding up the write operation as a whole.

SUMMARY

However, in the method of Reference 1, the writing time to the flash memory is not sufficiently shortened, and further shortening of the writing time is required. For example, in the configuration of Patent Document 1, if the number of selected cells at the time of data rewriting is increased, the throughput is improved and the writing time is shortened. However, as the number of selected cells increases, the load on the charge pump increases because more current is required. In addition, the influence of noise due to an increase in the amount of current also increases.

Other objects and novel features will become apparent from the description of this specification and the accompanying drawings.

Although semiconductor devices of a plurality of embodiments are described in this specification, a semiconductor device of an embodiment will be described as follows. The semiconductor device includes a plurality of memory cells, a memory controller for controlling the plurality of memory cells, and a sense amplifier for performing a determination process of whether or not a write operation to the memory cells has been completed. The memory controller performs a first write operation with a second write current having a current value smaller than the first write current simultaneously for a second number of memory cells having a larger number than the first number in the high-speed write mode than for a normal write mode in which a write operation with a first write current is performed for a first number of memory cells at the same time. At the completion of the first write operation, the memory controller simultaneously performs the second write operation by the third write current having a larger current value than the second write current with respect to the memory cell determined by the sense amplifier to have not completed the write operation in the determination process.

According to one embodiment, it is possible to increase the writing speed to the flash memory while suppressing an increase in noise.

BRIEF DESCRIPTION OF THE DRAWINGS

FIG. 4 is a diagram exemplifying the voltage values applied to the electrodes of the memory cell in the write operation, the erase operation, and the read operation with respect to the memory cell.

FIG. 8 is a diagram illustrating an effect of Embodiment 1 of the present invention.

FIG. 10 is a diagram showing a specific example of the low noise writing mode.

FIG. 13 is a diagram showing a list of verification results in the low-voltage writing mode.

DETAILED DESCRIPTION

Figure 1:
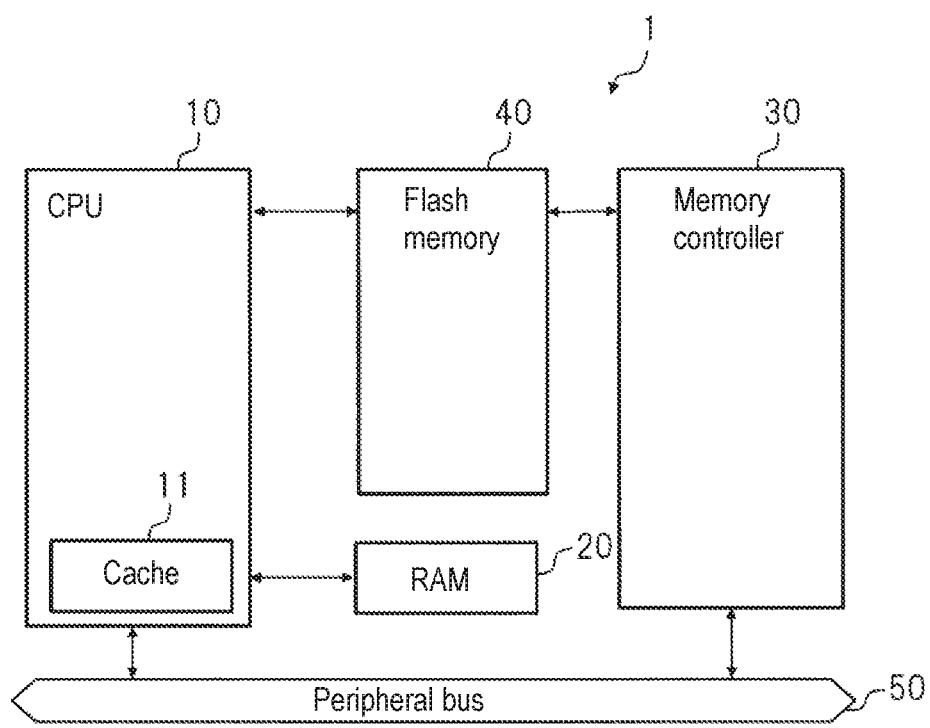
FIG. 1 is a block diagram showing an example of the configuration of a semiconductor device according to Embodiment 1 of the present invention.

In all the drawings for explaining the embodiments, the same portions are denoted by the same reference numerals in principle, and repetitive descriptions thereof are omitted.

Embodiment 1

In one embodiment, a semiconductor device that speeds write operation to a non-volatile memory will be described.
Configuration of a Semiconductor Device FIG. 1 is a block diagram showing an example of a configuration of a semiconductor device according to Embodiment 1 of the present invention. As shown in FIG. 1, the semiconductor device 1 includes a CPU 10, a RAM (Random Access Memory) 20, a memory controller 30, a flash memory (non-volatile memory) 40, and peripheral buses 50. The semiconductor device 1 is, for example, a vehicle-mounted semiconductor device mounted on an automobile or the like. As shown in FIG. 1, the CPU 10 and memory controller 30 is connected to a peripheral bus 50, and inputs and outputs various kinds of data via the peripheral bus 50.

The CPU 10 is functional blocks for performing arithmetic processing related to control of the constituent elements of the semiconductor device 1, arithmetic processing related to OTA, and the like. In addition, the CPU 10 performs arithmetic processes related to vehicle control in cooperation with various devices connected to the semiconductor device 1. The CPU 10 reads a program stored in the flash memory 40, and develops the read program in a RAM 20. The CPU 10 realizes functional blocks for realizing respective functions by executing programs expanded in the RAM 20. A cache 11 is provided inside the CPU 10, and frequently used information in the arithmetic process is stored in the cache 11. Further, the CPU 10 may directly execute a program (including information stored in the cache 11) read from the flash memory 40 without expanding the program in the RAM 20.

As described above, the RAM 20 expands programs read from the flash memory 40. In addition, the RAM 20 may temporarily store information or the like generated by an arithmetic process performed by the CPU 10.

The memory controller 30 is a functional block for controlling the flash memory 40. The memory controller 30 performs processing related to a write operation, a read operation, an erase operation, and the like with respect to the flash memory 40. More specifically, the memory controller 30 controls the write operation, the erase operation, and the read operation at the time of normal use or at the time of product testing before shipment. The memory controller 30 may independently control the flash memory 40 or may control the flash memory 40 based on signals outputted from the CPU 10. The operation of the memory controller 30 will be described in detail later.

Figure 2:
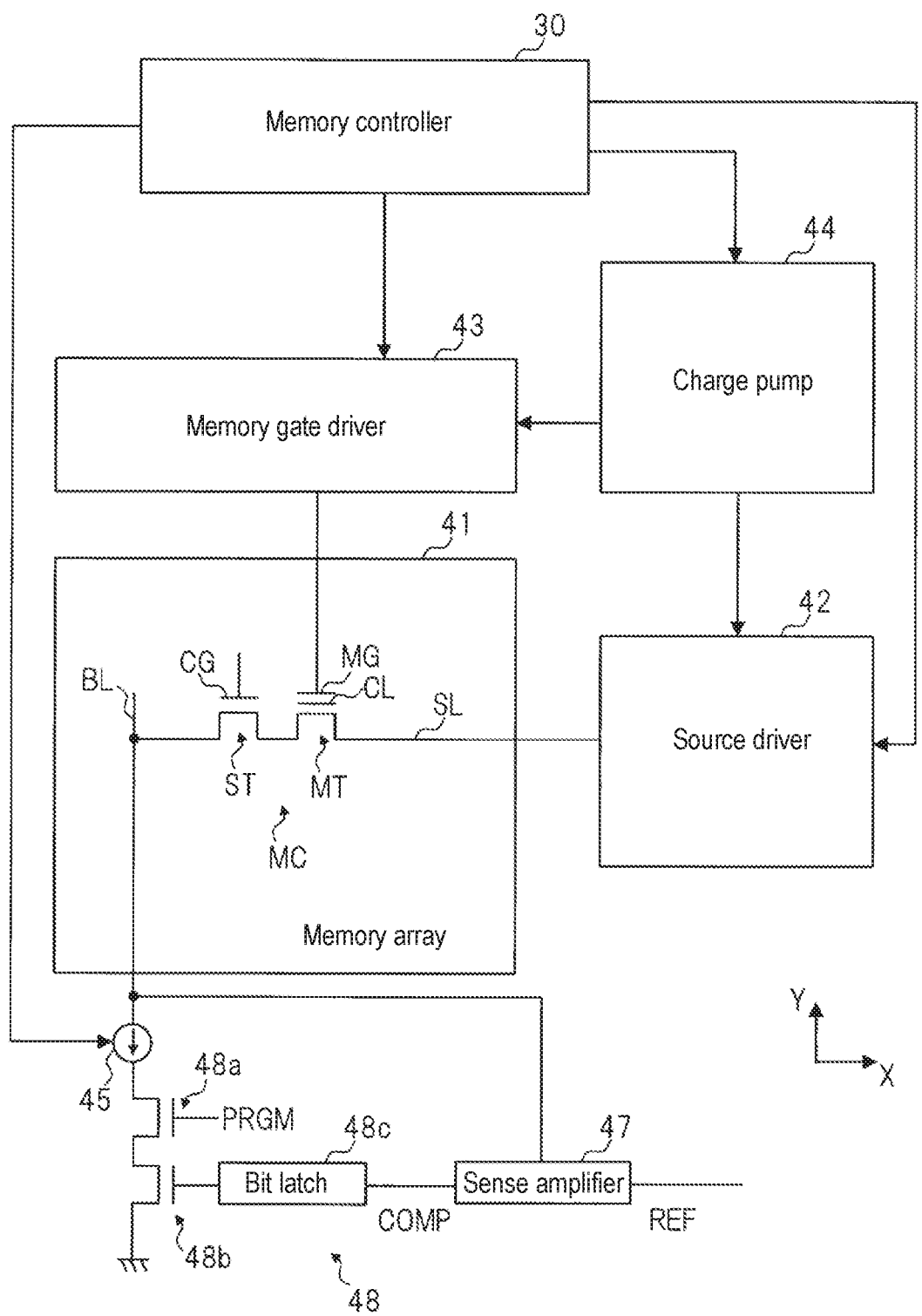
FIG. 2 is a block diagram showing an example of a configuration of a nonvolatile memory according to Embodiment 1 of the present invention.
Figure 3:
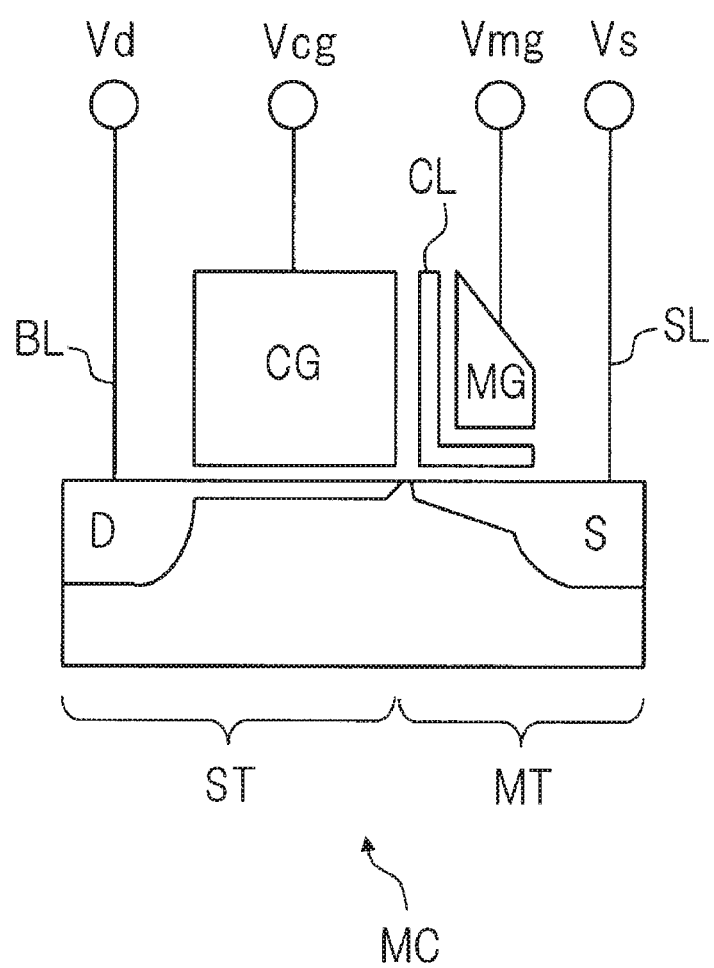
FIG. 3 is a cross-sectional view showing an example of the configuration of a memory cell according to Embodiment 1 of the present invention.

The flash memory 40 is a functional block for storing various information related to the semiconductor device 1. Although the flash memory 40 is exemplified as a nonvolatile memory in FIGS. 1 to 2, other nonvolatile memories may be used. FIG. 2 is a block diagram showing an example of a configuration of a nonvolatile memory according to Embodiment 1 of the present invention. FIG. 2 also shows a memory controller 30 in addition to the flash memory 40. FIG. 3 is a cross-sectional view showing an example of the configuration of a memory cell according to Embodiment 1 of the present invention. As shown in FIG. 2, the flash memory 40 includes a memory array 41, a source driver 42, a memory gate driver 43, a charge pump 44, a write current setting circuit 45, a sense amplifier 47, and a switch circuit 48.

Although the memory controller 30 and the flash memory 40 are shown separately in FIGS. 1 to 2, the flash memory 40 and the memory controller 30 may be integrally formed.

The memory array 41 includes a plurality of memory cells MC. Although only one memory cell MC is shown in FIG. 2 for convenience, a plurality of memory cells MC are actually arranged in an array. The plurality of memory cells MC are arranged in a lattice pattern along the bit lines BL extending in the Y direction and the source lines SL extending in the X direction shown in FIG. 2. More specifically, a plurality of bit lines BL extending in the Y direction are provided in the flash memory 40, and the plurality of bit lines BL are arranged in the X direction. A plurality of source lines SL extending in the X direction are provided in the flash memory 40, and the plurality of source lines SL are arranged in the Y direction. The plurality of memory cells MC are arranged corresponding to respective intersections of the plurality of bit lines BL and the plurality of source lines SL.

As shown in FIGS. 2 to 3, the memory cell MC includes a selection transistor ST and a memory transistor MT. One electrode of the selection transistor ST is connected to the bit line BL. One electrode of the memory transistor MT is connected to the source driver 42 via the source line SL. The other electrode of the selection transistor ST is connected to the other electrode of the memory transistor MT. As described above, in the memory cell MC, the selection transistor ST and the memory transistor MT are connected in series between the source line SL and the bit line BL. The selection transistor ST includes a control gate CG, and the memory transistor MT includes a charge storage layer CL and a memory gate MG. The memory gate MG is connected to the memory gate driver 43. As shown in FIG. 3, in the memory cell MC, the source line SL side is the source S, and the bit line BL side is the drain D.

The writing system of the flash memory exemplified here is a hot electron injection method in which a writing current flows between the drain and the source and charges are trapped in the charge storage layer CL. More specifically, a high voltage is applied to the memory gate MG and the source line SL, and a current flows between the drain and the source in a state in which charges are easily trapped. Then, the charge storage layer CL traps charges, whereby data is written into the memory cell MC. The charge storage layer CL may be a floating gate system or a charge trap type.

FIG. 4 is a diagram exemplifying the voltage values applied to the electrodes of the memory cell in the write operation, the erase operation, and the read operation with respect to the memory cell. In FIG. 4, Vd is a voltage applied to the drain D of the memory cell MC. That is, Vd is the voltage of the bit line BL. Vcg is a voltage applied to the control gate CG of the memory cell MC. Vmg is a voltage applied to the memory gate MG of the memory cell MC. Vs is a voltage applied to the source S of the memory cell MC. That is, Vs is the voltage of the source line SL.

As shown in FIG. 4, in the write operation, the voltages applied to the electrodes of the memory cell MC are set to Vd=0.5 [V], Vcg=1 [V], Vmg=10 [V], and Vs=5 [V], respectively. In the erase operation, voltages applied to the electrodes of the memory cell MC are set to Vd=0 V, Vcg=0 V, Vmg=−10 V, and Vs=5 V, respectively. In the read operation, voltages applied to the electrodes of the memory cell MC are set to Vd=1 [V], Vcg=1 [V], Vmg=0 [V], and Vs=0 [V], respectively. Note that these voltages are merely an example, and are appropriately changed in accordance with the characteristics of the memory cell MC.

The source driver 42 is a functional block for setting the potential of each source line SL. The source driver 42 is connected to the memory controller 30, the charge pump 44, and a plurality of source lines SL. The source driver 42 controls the voltage of each source line SL based on, for example, a signal output from the memory controller 30. The source driver 42 supplies, for example, a voltage generated by the charge pump 44 to the source line SL. At this time, the source driver 42 may supply the voltage generated by the charge pump 44 to the source line SL as it is, or may supply it to the source line SL after converting it to a predetermined voltage.

The memory gate driver 43 is a functional block for controlling the voltage of the memory gate MG of each memory transistor MT. The memory gate driver 43 is connected to the memory controller 30, the charge pump 44, and the plurality of memory gates MG. The memory gate driver 43 controls the voltage of each memory gate MG based on, for example, a signal output from the memory controller 30. The memory gate driver 43 supplies, for example, a voltage generated by the charge pump 44 to the memory gate MG. At this time, the memory gate driver 43 may supply the voltage generated by the charge pump 44 to the memory gate MG as it is, or may supply the memory gate MG after converting the voltage to a predetermined voltage. The memory gate driver 43 may control the control gate CG.

The charge pump 44 is a functional block for generating electric power to be supplied to the memory cell MC or the like. The charge pump 44 is connected to the memory controller 30, the source driver 42, and the memory gate driver 43. The charge pump 44 generates a voltage corresponding to a write operation, an erase operation, and a read operation based on a signal output from the memory controller 30, for example.

Referring to FIG. 4, in the write operation, the charge pump 44 generates a voltage of 10 V and supplies the voltage to the memory gate driver 43. The charge pump 44 generates a voltage of 5 [V] and supplies it to the source driver 42. In this case, the voltage supplied to the source driver 42 may be shunted in the process of generating the voltage supplied to the memory gate driver 43.

In the erase operation, the charge pump 44 generates a voltage of −10 V and supplies the voltage to the memory gate driver 43. The charge pump 44 generates a voltage of 5 [V] and supplies it to the source driver 42. During the read operation, the charge pump 44 generates a voltage of 5 V and supplies the voltage to the source driver 42 and the memory gate driver 43.

The write current setting circuit 45 is a functional block for setting a current value of a write current in a write operation to the memory cell MC. The write current setting circuit 45 is provided for each bit line BL, for example. The write current setting circuit 45 sets the current value of the write current based on the signal output from the memory controller 30. The setting of the write current will be described later in detail.

The sense amplifier 47 is a functional block for performing a determination process as to whether or not the write operation to the memory cell MC has been completed. The sense amplifier 47 is provided, for example, for each bit line BL. Each sense amplifier 47 is connected to a corresponding bit line BL and a bit latch 48c of a corresponding switch circuit 48. After the write operation, a read operation is performed, and the sense amplifier 47 compares the current flowing to the bit line BL by the read operation with the current of the reference signal REF supplied from the memory controller 30, for example. Such treatment is also referred to as verification. Then, for example, when the current flowing through the bit line BL is larger than the current of the reference signal REF, the sense amplifier 47 determines that predetermined data has been written in the memory cell MC, and outputs a write completion signal COMP to the bit latch 48c.

The switch circuit 48 is a functional block for switching whether a write operation to the memory cell MC is permitted or not. The switch circuit 48 is provided for each bit line BL. The switch circuit 48 includes a first switch 48a, a second switch 48b, and a bit latch 48c. The first switches 48a are formed of, for example, a NMOS (Negative Metal Oxide Semiconductor). One electrode of the first switch 48a is connected to the write current setting circuit 45. The other electrode of the first switch 48a is connected to one electrode of the second switch 48b. The gate electrode of the first switch 48a is connected to, for example, the memory controller 30. When a high-level write signal PRGM is supplied from the memory controller 30 to the gate electrode of the first switch, the first switch 48a is turned on. As a result, the write operation to the memory cell MC becomes possible.

The second switch 48b is an element for switching whether or not the write operation to the memory cell MC is permitted based on the determination result by the sense amplifier 47. The second switches 48b are formed of, for example, a NMOS. The other electrode of the second switch 48b is grounded. The gate of the second switch 48b is connected to the bit latch 48c. The second switch 48b switches on and off based on a signal output from the bit latch 48c.

The bit latch 48c outputs a predetermined signal based on the determination result in the sense amplifier 47 to the second switch 48b. At the start of the write operation, the bit latch 48c holds predetermined data, hereinafter also referred to as latch data. Based on the latch data, the bit latch 48c outputs, for example, a high-level signal to the gate electrode of the second switch 48b. At this time, the second switch 48b is turned on. When the write completion signal COMP is outputted from the sense amplifier 47 during the read operation after the write operation, the bit latch 48c inverts the latch data and holds the inverted latch data. Based on the inverted latch data, the bit latch 48c outputs, for example, a low-level signal to the gate electrode of the second switch 48b. As a result, the second switch 48b is turned off, and writing to the corresponding memory cell MC is prohibited.

Normal Write Mode

Figure 5:
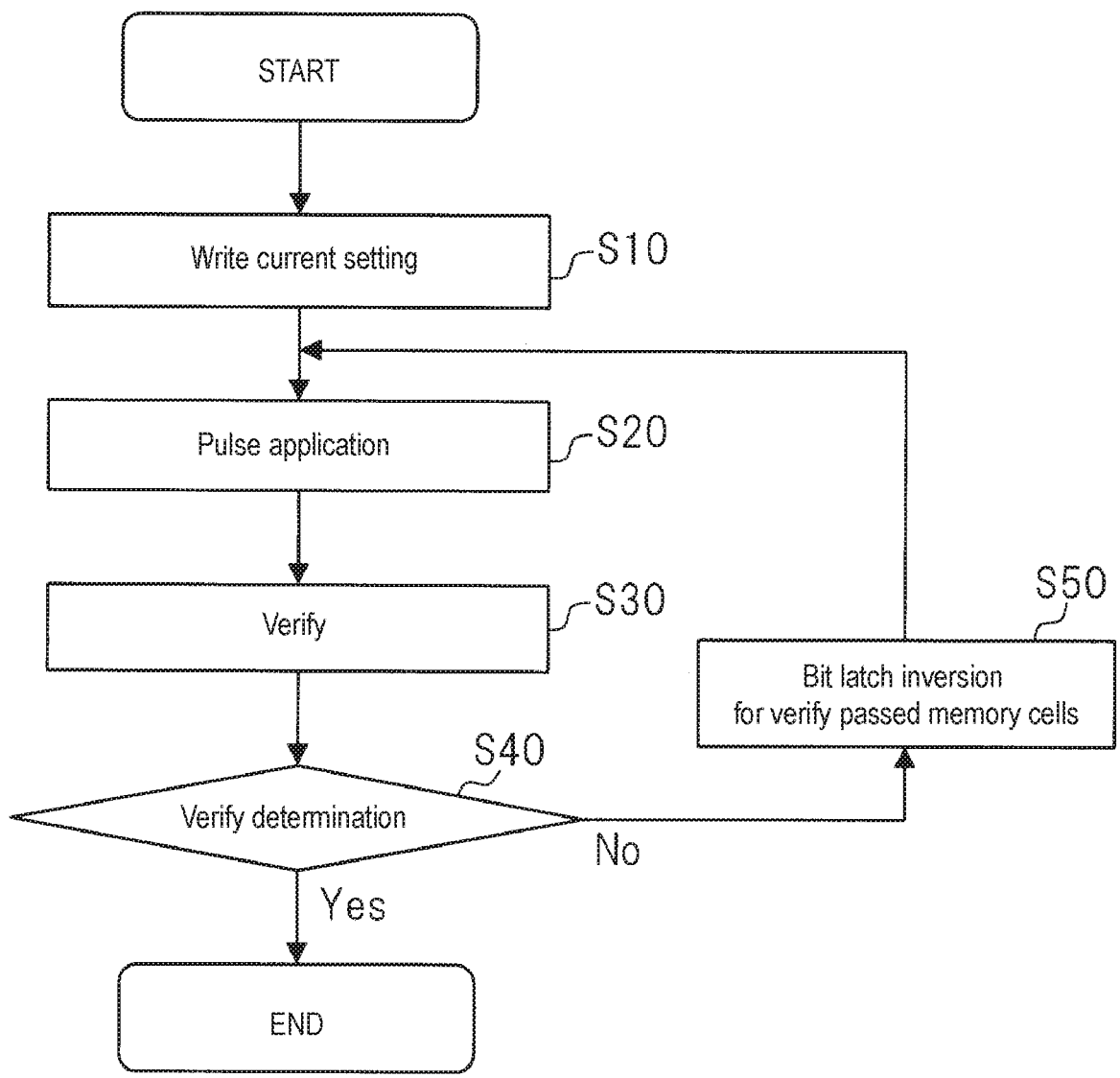
FIG. 5 is a flowchart showing an example of the normal write mode.

Here, the normal write mode will be described. FIG. 5 is a flowchart showing an example of the normal write mode. As shown in FIG. 5, in the normal writing mode, the processes of steps S10 to S50 are performed. At the start of the normal write mode, it is assumed that the memory cell MC to be written is selected by the memory controller 30, and the corresponding switch circuit 48 is in the ON state. For example, it is assumed that the memory cell MC to be written is selected for each bit line BL, and the first switch 48a and the second switch 48b of the switch circuit 48 corresponding to the bit line of the selected memory cell MC are in an on state.

First, step S10 is a step of setting the current value of the write current. The write current setting circuit 45 sets the current value of the write current to A1 (hereinafter also referred to as the current value A1) based on, for example, a signal from the memory controller 30. Specifically, the memory controller 30 changes the current of the constant current source in accordance with the current value A1 to be set. Then, the memory controller 30 generates a mirror current having a current value A1 by the current mirror circuit, and supplies the generated mirror current to the write current setting circuit 45. The current value A1 is, for example, a value having a sufficient margin with respect to the lower limit value of the write current to the memory cell MC under the worst condition.

In step S20, a write operation is performed by the write current of the current value A1 set in step S10. More specifically, the memory controller 30 applies a pulse of a write current having a current value A1 to the memory cell MC to be written.

In step S30, verification is performed on the memory cell MC to which the pulse is applied. In other words, the determination process is performed for each bit line BL. First, in step S20, a read operation is performed on the memory cell MC to which the pulse is applied. At this time, a voltage corresponding to the read operation of FIG. 4 is applied to each electrode of the memory cell MC to be verified. Each sense amplifier 47 compares the current flowing through the bit line BL with the current of the reference signal REF, thereby verifying the corresponding memory cell MC. For example, when the current of the corresponding bit line BL is larger than the reference current REF, the sense amplifier 47 determines that predetermined data has been written in the corresponding memory cell MC, and outputs write completion signals COMP to the bit latches 48c of the corresponding switching circuits 48.

In step S40, it is determined whether or not all the memory cells MC to which the pulse is applied in step S20 pass the verify. The memory controller 30 terminates the normal write mode when it is determined that all memory cell MCs have passed the verify (Yes). On the other hand, if the memory controller 30 determines that at least some of the memory cells MC fail the verification (NO), the process proceeds to step S50.

In step S50, the switch circuit 48 corresponding to the memory cell MC which has passed the verification is set to the OFF state. More specifically, when the verify is passed, the corresponding sense amplifier 47 outputs the write completion signal COMP to the corresponding switch circuit 48. When the write completion signal COMP is inputted, the bit latch 48c inverts the held latch data, and outputs a low-level signal to the gate electrodes of the second switches 48b based on the inverted latch data. As a result, the second switch 48b is turned off. In this manner, when the verify is passed, the corresponding switch circuit 48 is turned off, the corresponding memory cell MC is masked, and the additional pulse application and the verify are not performed.

When the treatment of step S50 is completed, the processing of step S20 and subsequent steps is performed again. In steps S20 to S30 again, pulse application and verification are performed again on the memory cell MC for which verification failed in the immediately preceding step S30, that is, the memory cell MC which is not masked. The current value of the write current at this time is A1 set in step S10. If it is determined in step S40 that all the memory cells MC have passed the verify operation (Yes), the normal write operation ends. Thus, the processes of pulse application (S20), verify (S30), verify determination (S40), and bit latch inversion (S50) are repeatedly performed until all the memory cells MC pass the verify.

The operation of step S50 may be performed subsequent to step S30. In this case, when it is determined in step S40 that all the memory cells MC pass the verify, all the corresponding switch circuits 48 are turned off.

Depending on the usage situation, the memory controller 30 may select a different group of memory cells MC and perform a write operation in the normal write mode to the selected memory cells MC, or may repeat such treatment to perform a write operation to all the memory cells MC.

High-Speed Write Mode

Figure 6:
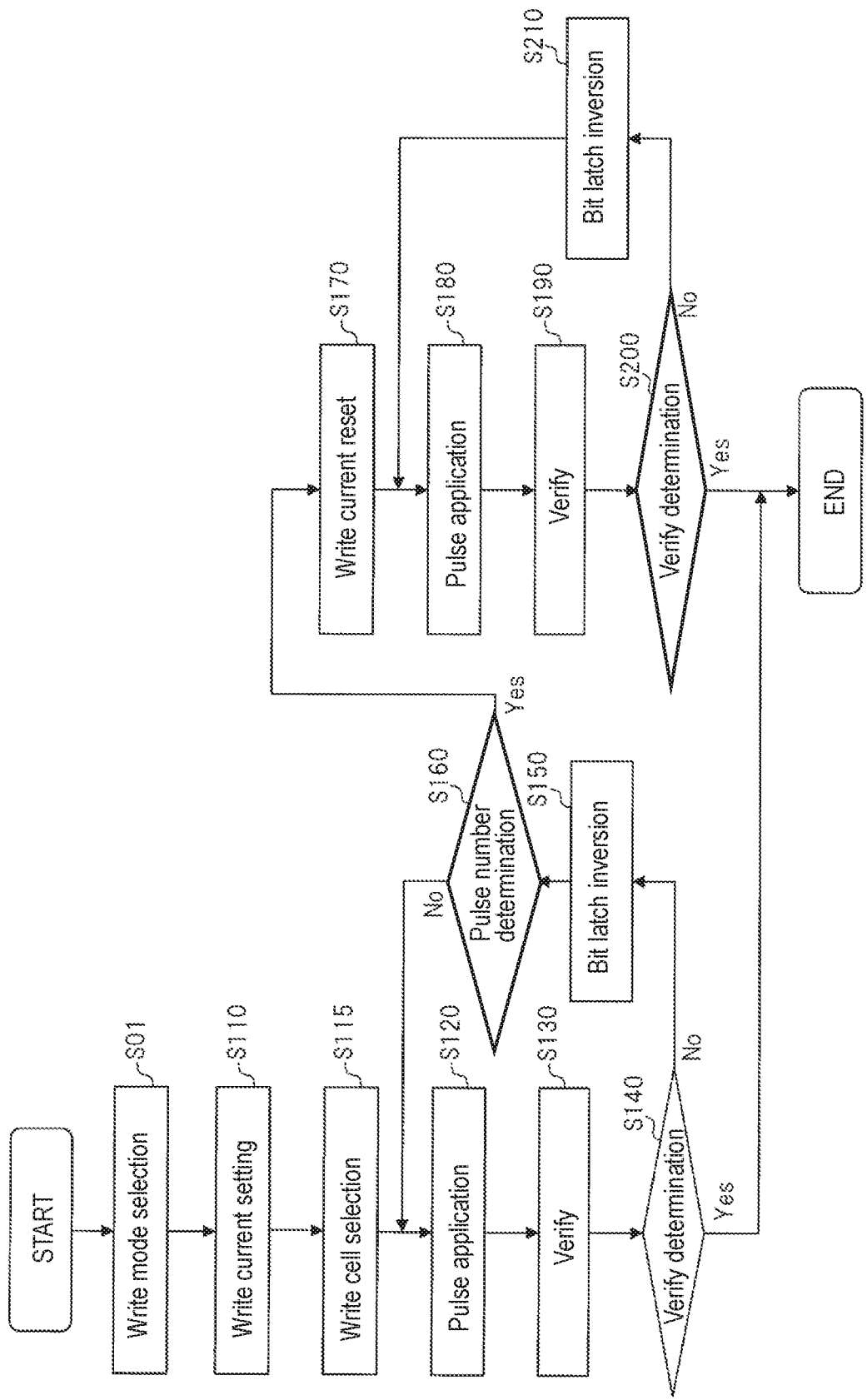
FIG. 6 is a flowchart showing an example of the high-speed writing mode.

Next, the high-speed write mode will be described. FIG. 6 is a flowchart showing an example of the high-speed writing mode. Some of the steps involved in FIG. 6 are similar to FIG. 5. Therefore, in the description of FIG. 6, portions overlapping with those of FIG. 5 are omitted as appropriate.

In the high-speed writing mode, as shown in FIG. 6, the processes of steps S01 to S210 are performed in the high-speed writing mode. Of these steps, step S110-S160 is the first write operation and step S170-S210 is the second write operation.

Step S01 is a step of selecting a write mode. For example, the memory controller 30 selects either a high-speed write mode or a low noise write mode, which will be described later. Here, it is assumed that the high-speed write mode is selected.

Step S110 is a step of setting the current value of the write current, i.e., the second write current value. Since the step S110 is similar to the step S10, the difference will be mainly described. The memory controller 30 changes the current of the constant current source in accordance with the current value A2 to be set. Then, the memory controller 30 generates a mirror current having a current value A2 by the current mirror circuit, and supplies the generated mirror current to the write current setting circuit 45. In this manner, the current value A2 of the write current is set. The current value A2 of the second write current is smaller than the current value A1 of the first write current (A2 1). Specifically, in the high-speed write mode, the memory controller 30 sets the current value of the write current to ½ times the current value in the normal write mode.

Figure 7:
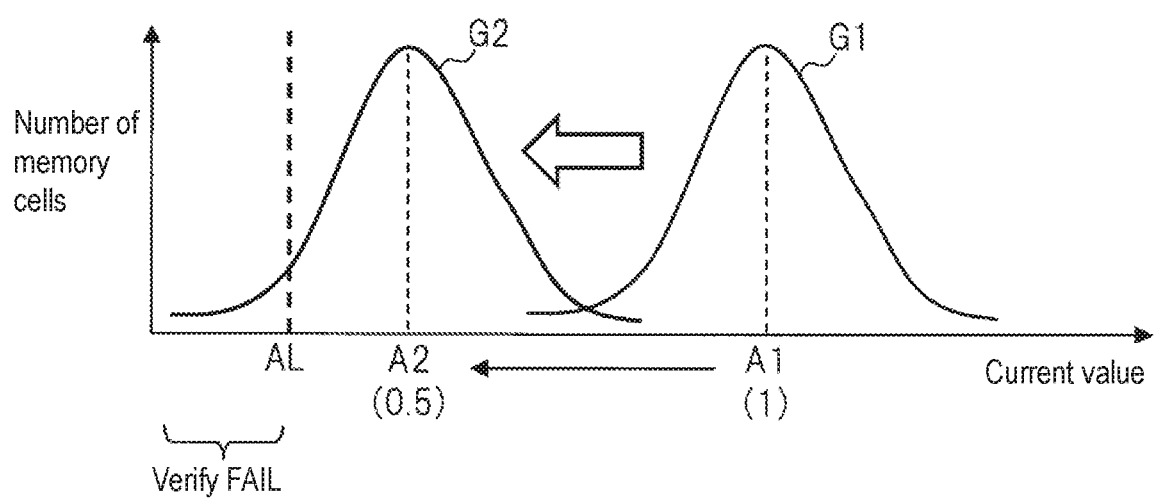
FIG. 7 is a diagram comparing the write current in the normal write mode and the write current in the high-speed write mode.

FIG. 7 is a diagram comparing the write current in the normal write mode and the write current in the high-speed write mode. In FIG. 7, the horizontal axis represents the current value of the write current, and the vertical axis represents the number of memory cells MC. In FIG. 7, a curve G1 shows the distribution of the write current with respect to the number of memory cells MC in the normal write mode. The write current in the normal write mode has a distribution in which the current value A1 of the write current has the highest peak with respect to the set current value A1.

On the other hand, the curve G2 shows the distribution of the write current with respect to the number of memory cells MC in the first write operation in the high-speed write mode. The write current in the first write operation has a distribution with the current value A2 as a peak. As shown in FIG. 7, the current value A2 of the write current in the first write operation is close to the lower limit value AL of the write current to the memory cell MC in the worst condition. Therefore, a part of the write current may include a current having a current value smaller than the lower limit value AL of the write current for the memory cell MC under the worst condition. If the write operation is performed under such a condition, there is a possibility that the write operation is not completed in the first write operation, but the memory cell MC is subjected to a second write operation, which will be described later.

In step S115, the memory cells MCs to be simultaneously written by the first write operation are selected. For example, the memory controller 30 is selected for each bit line BL, for example. The number (second number) of the memory cells MC selected here is larger than the number (first number) of the memory cells selected in the normal write mode. For example, the second number is two times the first number. That is, in the high-speed write mode, the memory controller 30 selects twice as many memory cells as in the normal write mode.

The current values of the write currents set in step S110 and the number of memory cells MCs selected in step S115 are not limited to these values. More specifically, the current value of the write current and the number of memory cells MC are set so that the product of the second number and the current value of the second write current is equal to or less than the product of the first number and the current value of the first write current. As a result, a high-speed write operation can be performed within the capacity of the charge pump 44.

In step S120, similar to step S20, pulses of a write current having a current value A2, for example, are simultaneously applied to the second number of memory cells MC selected in step S115.

In step S130, the memory cell MC to which the pulses of the write current of the current value A2 are applied is verified. The other treatment is the same as that in step S30, and therefore description thereof is omitted. That is, in the first write operation, the determination process is performed by the sense amplifier 47 every time a pulse is applied once.

In step S140, it is determined whether all the memory cells MCs pulsed in step S120 have passed the verify. The memory controller 30 exits the high-speed write mode when it is determined that all memory cell MCs have passed the verify (Yes). On the other hand, if the memory controller 30 determines that at least some of the memory cells MCs fail the verify operation, the process proceeds to step S150.

In step S150, the same process as in step S50 is performed. That is, the memory cell MC that has passed the verification is masked, and additional pulse application and verification are not performed. As described above, the switch circuit 48 is provided corresponding to each of the memory cells MC in which the first write operation is performed, and the necessity of the second write operation is switched based on the determination result of the sense amplifier 47.

In step S160, it is determined whether the pulses have been applied a predetermined number of times, i.e., a first number of times, N1. If the number of pulses applied is less than N1, the process of step S120 is continued. On the other hand, when the number of pulses to be applied reaches N1 (Yes), the process shifts to step S170, and the second writing operation is continuously performed. That is, even after N1 pulses are applied and the first write operation is performed, the second write operation is continuously performed on the memory cell MC for which the write operation is not completed.

However, the ratio of the number of memory cells MC in which the second write operation is performed is very small compared with the second number. As described with reference to FIG. 7, when a pulse of a write current having a current value smaller than the lower limit Value AL of the write current is applied to the memory cell MC in the worst condition, the second write operation is performed.

Step S170 is a step of setting the current value of the write current, i.e., the third write current value. Step S170 is similar to steps S10 and S110. The memory controller 30 sets the current value A3 of the third write current to a value larger than the current value A2 of the second write current (A3>A2). For example, the current value A3 of the third write current may be set to be the same as the current value A1 of the first write current (A3=A1). According to this configuration, the load related to the setting of the write current is reduced, and an increase in the circuit scale is suppressed.

Here, an example is shown in which verification is performed every time a pulse is applied once, but verification may be performed after a pulse is applied N1 times. According to this configuration, since the number of times of the determination processing and the reading operation by the sense amplifier 47 is reduced, the first writing operation is performed at a higher speed.

In step S180, when the first write operation is completed, pulses of a write current of, e.g., a current value A3 are simultaneously applied to the memory cells MCs determined by the determination process that the write operation is not completed by the sense amplifier 47. The step S180 is similar to the step S120 and the like.

In step S190, the memory cell MC to which the pulses of the write current of the current value A3 are applied is verified. Step S190 is similar to step S130.

In step S200, it is determined whether or not the memory cell MC has passed the verify operation. At this time, the memory controller 30 determines only the memory cells MCs to which pulses are applied in the step S190. The memory controller 30 exits the high-speed write mode when it is determined that all memory cell MCs have passed the verify (Yes). On the other hand, if the memory controller 30 determines that at least some of the memory cells MCs fail the verify operation, the process proceeds to step S210.

In step S210, the same process as in step S150 and the like is performed. That is, the memory cell MC that has passed the verification is masked, and additional pulse application and verification are not performed.

When the process of step S210 is completed, the process of step S180-S200 is performed again. The process of the step S180-S200 is repeated until all the memory cells MC pass the verify operation. Note that in the second write operation, since the write current is larger than that in the first write operation, the write operation is almost completed by one or several pulse applications. However, since the write operation may not be completed due to the failure of the memory cell MC, the upper limit of the number of times of pulse application may be limited to a predetermined number of times.

Main Effect of the Present Embodiment

According to the present embodiment, in the high-speed write mode, the first write operation by the second write current is simultaneously performed on the second number of memory cells MC. Then, at the completion of the first write operation, the second write operation by the third write current is simultaneously performed on the memory cell MC determined by the sense amplifier 47 that the write operation has not been completed in the determination process.

That is, in the first write operation, the write operation to most of the memory cells MC is completed with a write current having a current value smaller than that of the normal write operation, and in the second write operation, the write operation is performed with a write current having a current value larger than that of the remaining few memory cells MC. According to this configuration, since the throughput can be improved, it is possible to increase the writing speed to the flash memory 40 while suppressing an increase in noise. As a result, the test time is shortened and the test cost is reduced.

According to the present embodiment, in the first write operation, the sense amplifier 47 performs a verify process every time a pulse is applied once. According to this configuration, when the write operation to all the memory cells MC is completed less than the predetermined number of times N1, the write operation can be immediately stopped, and the write operation can be performed at higher speed.

According to the present embodiment, the current value of the write current and the number of memory cells MC are set so that the product of the second number and the current value of the second write current is equal to or less than the product of the first number and the current value of the first write current. As a result, the peak current in the high-speed writing mode is smaller than that in the normal writing mode, and thus noise is reduced. This makes it possible to stabilize the operation of the software during OTA. According to this configuration, the high-speed write operation can be performed within the capacity of the charge pump 44. In addition, since the existing charge pump 44 can be used, the number of man-hours required for circuit design can be shortened.

FIG. 8 is a diagram illustrating an effect of the first embodiment of the present invention. FIG. 8 shows the items of the current value of the write current, the number of selected memory cells MC, the capacity of the charge pump 44, and the write speed in comparison with the normal write mode and the high-speed write mode. Note that each numerical value in FIG. 8 is shown as a ratio to the normal write mode. That is, in FIG. 8, the value of each item in the normal write mode is "1".

FIG. 8 shows numerical values when the write current is ½ (0.5) of the normal write mode and the number of memory cells MC to be simultaneously written is twice the number of memory cells MC in the normal write mode in the first write operation of the high-speed write mode. At this time, the capacity of the charge pump 44 is substantially the same as that of the normal write mode.

On the other hand, in the second write operation, the current value of the write current is the same as that in the normal write mode, but the number of memory cells MC to be simultaneously written is much smaller than that in the normal write mode. Thus, the charge pump 44 can operate at a much lower capacity than the normal write mode. Further, in the second writing operation, the number of pulse application times is 1 to several times, so that there is little influence on the writing speed. Therefore, the writing speed in the high-speed writing mode is twice as high as that in the normal writing mode.

Embodiment 2

Next, an embodiment will be described. In this embodiment, a semiconductor device capable of writing operation with lower noise than one of the embodiments will be described.

Low Noise Write Mode

Figure 9:
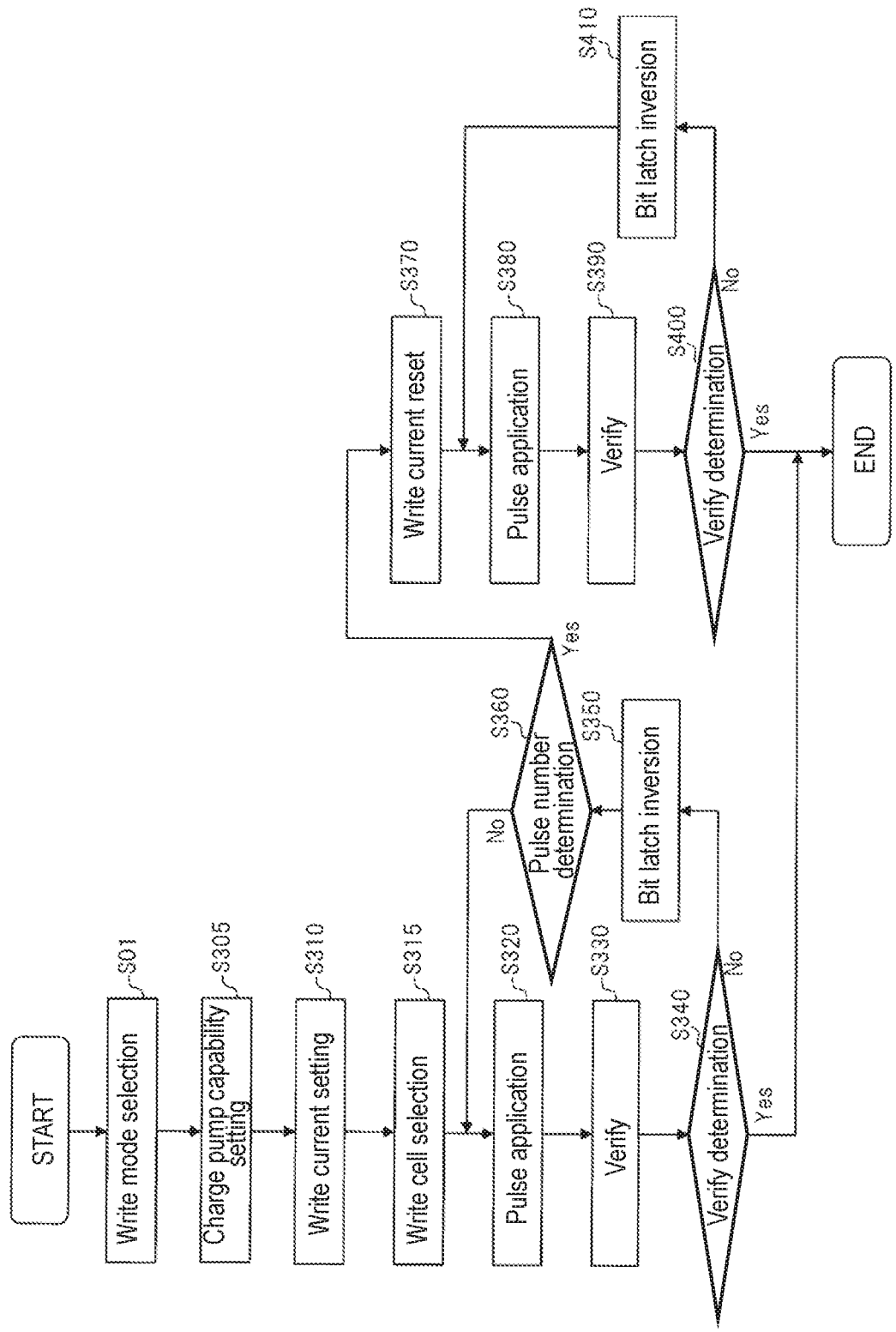
FIG. 9 is a flowchart showing an example of the low noise writing mode.

FIG. 9 is a flowchart showing an example of the low noise writing mode. Some of the steps involved in FIG. 9 are similar to FIG. 6. Therefore, in the description of FIG. 9, portions overlapping with those of FIG. 6 are omitted as appropriate.

In the low-noise writing mode, as shown in FIG. 9, the processes of steps S01 to S410 are performed in the low-noise writing mode. Among these steps, step S305-S360 is a third write operation, and step S370-S410 is a fourth write operation. Step S01 is a step of selecting a write mode. Here, it is assumed that the low noise writing mode is selected.

Step S305 is a step of setting the capacity of the charge pump 44. The capacity of the charge pump 44 is a value defined by a write current to the memory cell MC and the number of memory cells MC to be written simultaneously. In the low noise write mode, the memory controller 30 sets the capacity of the charge pump 44 lower than in the normal write mode. Specifically, the capacity of the charge pump 44 in the low noise writing mode is set to a value of ½ (0.5) or ¼ (0.25) of the normal writing mode.

For example, the memory controller 30 sets the capacity of the charge pump 44 by switching the cycle of the ring oscillator included in the charge pump 44 or the radix of the charge pump 44.

Step S310 is a step of setting the current value A4 of the write current (fourth write current). Step S310 is similar to step S110, etc. The difference is that the write current is set based on the capacity of the charge pump 44. The current value A4 of the fourth write current is set to a value smaller than the current value A1 of the first write current (A4<A1).

In step S315, the memory cells MCs to be simultaneously written are selected by the third write operation. The third number of memory cells MC selected in step 315 is set based on the capacity of the charge pump 44. For example, the third number is equal to or less than the first number of memory cells MC selected in the normal write mode. In this respect, the low noise writing mode is different from the high speed writing mode. The current value A4 of the fourth write current and the third number of memory cells MC are set within a range in which the product of the current value A4 and the third number does not exceed the capacity of the charge pump. The order of the S310-S315 of steps may be interchanged according to circumstances.

FIG. 10 is a diagram showing a specific example of the low noise writing mode. FIG. 10 shows the items of the current value of the write current, the number of selected memory cells MC, the capacity of the charge pump 44, and the write speed in comparison with the normal write mode and the low noise write mode. Note that each numerical value in FIG. 10 is shown as a ratio to the normal write mode. That is, in FIG. 10, the value of each item in the normal write mode is "1".

The middle part of FIG. 10 shows a case where the capacity of the charge pump 44 is set to a value of 0.5 which is ½ of the normal write mode. At this time, the current value of the write current is set to, for example, ½ (0.5) of the normal write mode. The number of memory cells MC to be simultaneously written is the same as that in the normal write mode. The product of the current value and the number of memory cells MC is 0.5, which is a value not exceeding the capacity of the charge pump 44.

On the other hand, the lower part of FIG. 10 shows a case where the capacity of the charge pump 44 is set to a value equal to ¼ (0.25) of the normal write mode. At this time, the current value of the write current is set to, for example, ½ (0.5) of the normal write mode. The number of memory cells MC to be simultaneously written is set to 0.5, which is ½ times the number of memory cells MC in the normal write mode. The product of the current value and the number of memory cells MC is 0.5, which is a value not exceeding the capacity of the charge pump 44. Of course, the number of the current values and the number of the memory cells MC shown individually is merely an example, and can be arbitrarily set within a range not exceeding the capacity of the charge pump 44.

Step S320 is the same as step S120 and the like, and pulses of a write current of, e.g., a current value A4 are simultaneously applied to the third number of memory cells MC selected in step S315.

In step S330-S340, the same process as in step S130-S140 is performed. In step S340, if it is determined in step S320 that all the memory cells MCs to which pulses have been applied pass the verify, the low noise write mode is terminated. On the other hand, when it is determined that at least some of the memory cells MCs fail the verification, the process of step S350 is performed.

In step S350-S360, the same process as in step S150-S160 is performed. The number of applying (second number) N2 determined in the step S360 may be equal to or differ from the first number of pulses in the high-speed write mode.

Step S370 is a step of setting the current value A5 of the write current, i.e., the fifth write current. Step S370 is similar to step S170, etc. The memory controller 30 sets the current value A5 of the fifth write current to a value larger than the current value A4 of the fourth write current (A5>A4). The current value A5 of the fifth write current may be set to the same value as the current value A1 of the first write current, for example, as shown in FIG. 10 (A5=A1). According to this configuration, the load related to the setting of the write current is reduced, and an increase in the circuit scale is suppressed.

Since most of the memory cells MC pass the verify operation in the fourth write operation, the number of memory cells MC determined by the sense amplifier 47 that the write operation has not been completed in the determination process is very small when the third write operation is completed. Therefore, even if the current value A5 of the fifth write current is set to the same value as A1, the capacity of the charge pump 44 is not exceeded.

Step S380 is the same as step S180 and the like, and when the third write operation is completed, a pulse of a write current of, e.g., a current value A5 is simultaneously applied to the memory cell MC determined by the sense amplifier 47 that the write operation is not completed by the determination process.

In step S390-S400, the same process as in step S190-S200 and the like is performed. In step S400, when it is determined in step S390 that all the memory cells MCs to which pulses are applied pass the verify, the low noise write mode is terminated. On the other hand, when it is determined that at least some of the memory cells MCs fail the verification, the process of step S410 is performed. In step S410, the same process as in step S210 and the like is performed.

According to the present embodiment, it is possible to perform the write operation with noise reduced more than in the high-speed write mode.

As described above, it is assumed that the number of memory cells MC selected in the third write operation is equal to or less than the first number. However, if the capacity of the charge pump 44 is not exceeded, the number of the memory cells MC may be set to a value larger than the first number. In this case, the writing operation is performed in which the noise is further reduced while the writing speed is improved.

Embodiment 3

Next, Embodiment 3 will be described. In this embodiment mode, a low-voltage writing mode will be described. In the low-voltage write mode, the write operation is performed while switching the threshold voltage of the memory cell MC and the current value of the write current.

Low-Voltage Write Mode

Figure 11:
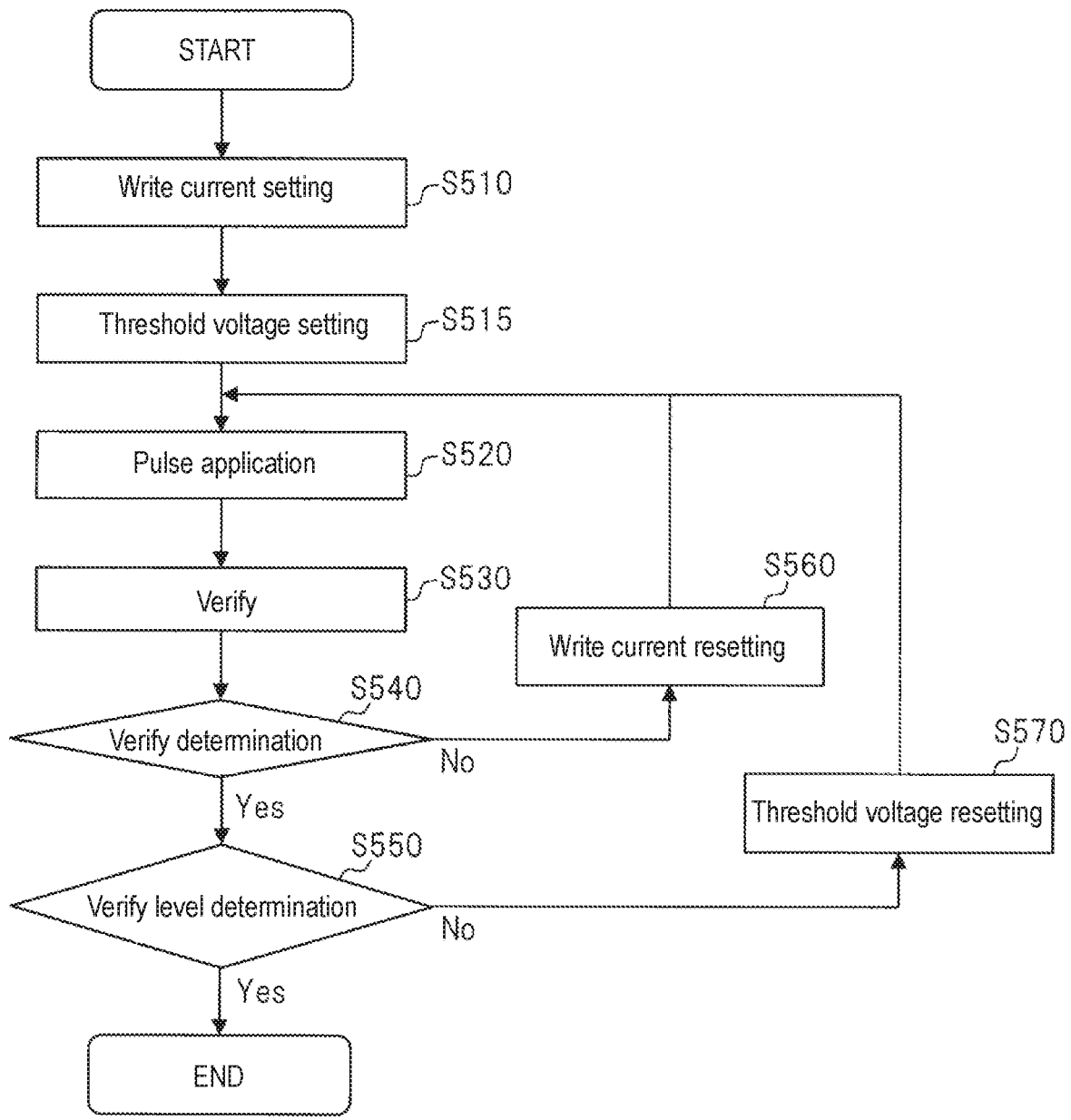
FIG. 11 is a flowchart showing an example of the low-voltage writing mode.
Figure 12:
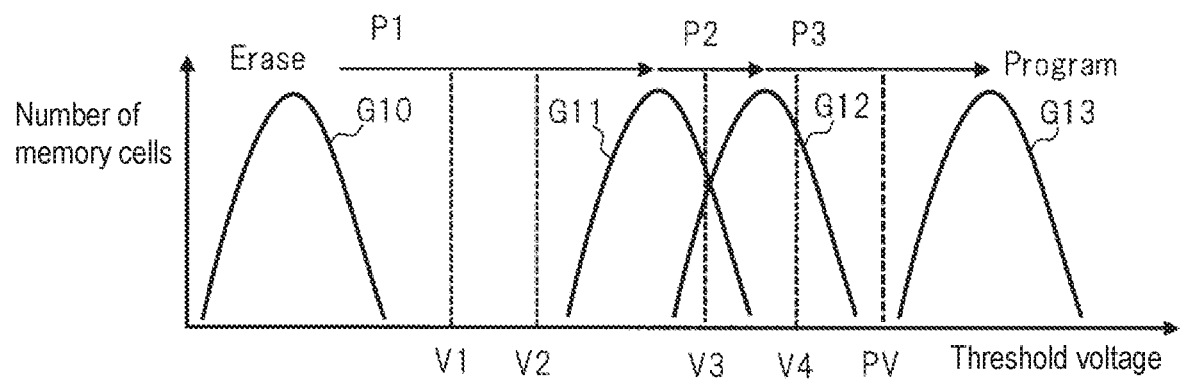
FIG. 12 is a diagram showing the relationship between the write current and the threshold voltage in the low-voltage write mode.

FIG. 11 is a flowchart showing an example of the low-voltage writing mode. As shown in FIG. 11, in the low-voltage writing mode, the process of step S510-S570 is performed in the low-voltage writing mode. FIG. 12 is a diagram showing the relationship between the write current and the threshold voltage in the low-voltage write mode. In FIG. 12, the horizontal axis represents the threshold voltage of the memory cell MC, and the vertical axis represents the number of the memory cells MC. A curve G10 in FIG. 12 shows the distribution of the threshold voltages of the memory cells MC in the erased state before the start of the write operation. FIG. 13 is a diagram showing a list of verification results in the low-voltage writing mode.

Step S510 is a step of setting a current value of the write voltage to an initial current value. The step S510 is similar to the step S110 and the like. Step S515 is a step of setting the threshold voltage of the memory cell MC to an initial threshold voltage, e.g., V1. For example, the memory controller 30 internally stores threshold value correspondence information for associating the threshold voltage with the gate voltage (or gate current) of the memory cell MC, and outputs a threshold value setting signal corresponding to the initial threshold value to the charge pump 44 based on the threshold value correspondence information. Then, the charge pump 44 supplies a voltage (or current) corresponding to the initial threshold value to the gate electrode based on the threshold value setting signal. The threshold correspondence information may be stored in a storage area of a program or the like in the flash memory 40.

In step S520, pulses of the write current having the current values set in step 510 are applied to the selected memory cells MCs, respectively. The step S520 is similar to the step S120 and the like. Since this is the first pulse application, the pulse of the write current of the initial current value is applied to the memory cell MC.

In the step S520, the number of times the pulses are applied to the memory cell MC is preferably a plurality of times, for example, a sufficient number of times in the high-speed write mode, a sufficient number of times in the low noise write mode, and the like. This is because, when the number of pulse applications is one or several, writing becomes insufficient, resulting in an increase in the current value of the writing current, and there is a fear that writing at a low current, which is an object of this embodiment mode, cannot be achieved.

The step S530-S540 is similar to steps S130 through 140. If it is determined in step S140 that all the selected memory cells MC pass the verify, the process of step S550 is performed. For example, when the pulse P1 is applied, the threshold distribution of the memory cell MC changes from the curve G10 in the erased state to the curve G11 as shown in FIG. 12. Considering the curve G11, the minimum value of the threshold voltage of the memory cell MC is larger than the initial threshold voltage V1. Then, as shown in FIG. 13, all the memory cells MC pass the verify operation.

In step S550, it is determined whether or not the present threshold voltage is the final threshold voltage PV at which it is determined that the write operation is finally completed. Since the current threshold voltage is V1, the memory controller 30 determines that the current threshold voltage is not PV, and executes the process of step S570.

Step S570 is a step of resetting the threshold voltages of the memory cells MCs. Step S570 is similar to step S515. In this step S570, the threshold voltage is set to a threshold voltage higher than the initial threshold voltage, e.g., V2. Then, the process of step S520-S540 is performed again. At this time, the pulse applied to the memory cell MC is P1 because the current value is not reset. As shown in FIG. 12, the minimum value of the threshold voltage of the memory cell MC is larger than the threshold voltage V2. Therefore, as shown in FIG. 13, this time, all the memory cells MC pass the verify operation (Yes). Also in this step S550, it is determined that the threshold voltage V2 is not the final threshold voltage PV, and the process of step S570 is executed.

In step S570, after the threshold voltage is set to V3, which is higher than the threshold voltage V2, for example, the process of step S520-S540 is performed. However, the threshold voltage V3 is higher than the minimum value of the threshold voltage of the memory cell MC. Therefore, in this step S540, as shown in FIG. 13, at least some of the memory cells MCs fail the verify operation, and the process of step S560 is performed.

Step S560 is a step of resetting the current values of the write currents. The step S560 is similar to the step S510 and the like. In this step S560, the current value of the write current is switched to a value larger than the initial current value, for example. Then, the process of step S520-S540 is performed again. In this step S520, pulses P2 of the write current having the current values set in the immediately preceding step S560 are applied to the memory cells MCs.

For example, when the pulse P2 is applied, the threshold distribution of the memory cell MC becomes a curve G12 from G11 as shown in FIG. 12. Considering the curve G12, the minimum value of the threshold voltage of the memory cell MC is smaller than the threshold voltage V3. Therefore, as shown in FIG. 13, at least some of the memory cells MCs fail the verify operation (No) even in the present S540 of steps.

In this step S560, the current value of the write current is switched to a value larger than the current value. Then, the process is performed again in steps S520 to S540. In this step S520, pulses P3 of the write current having the current values set in the immediately preceding step S560 are applied to the memory cells MCs.

For example, when the pulse P3 is applied, the threshold distribution of the memory cell MC becomes a curve G13 from G12 as shown in FIG. 12. Considering the curve G13, the minimum value of the threshold voltage of the memory cell MC is larger than the threshold voltage V3. Therefore, as shown in FIG. 13, in the present step S540, it is determined that all the memory cells MC have passed (Yes) the verify operation.

As shown in FIG. 12, when the pulse P3 is applied, the minimum value of the threshold voltage of the memory cell MC is larger than the threshold voltage V4 and the final threshold voltage PV. Therefore, after that, the treatments of the steps S550, the steps S570, and the S520-S540 are repeatedly performed until the threshold voltage reaches the threshold voltage PV. Then, in the last step S550, it is determined that the threshold voltage is PV (Yes), and the low-voltage write mode ends.

According to the present embodiment, the write operation at the final threshold voltage PV is performed by gradually increasing the current value of the threshold voltage and the write current from the initial value while checking the result of the verification for the memory cell MC. In the above-described embodiment, a pulse having a writable current amount at the final threshold voltage PV must be applied to the memory cell MC from the beginning, but in the present embodiment, the write operation to the memory cell MC is performed while gradually increasing the write current from a small amount.

According to this configuration, the write operation can be efficiently performed from the low voltage state, and power consumption related to the write operation is suppressed. In addition, since the current consumption is reduced, noise can be reduced.

Note that in this embodiment mode, for example, even if the threshold voltage does not reach PV, the write operation during OTA may be speeded up by temporarily suspending the write operation after the write operation is performed until the threshold voltage reaches a predetermined threshold voltage. For example, when the ignition is turned off, the writing operation may be resumed and the writing operation may be performed until the threshold voltage reaches PV.

In the present embodiment, although a pulse is applied to the memory cell MC after the threshold voltage is changed in the step S570, the pulse application performed after the threshold voltage is reset may be omitted as appropriate. As a result, the writing speed is increased.

Embodiment 4

Figure 14:
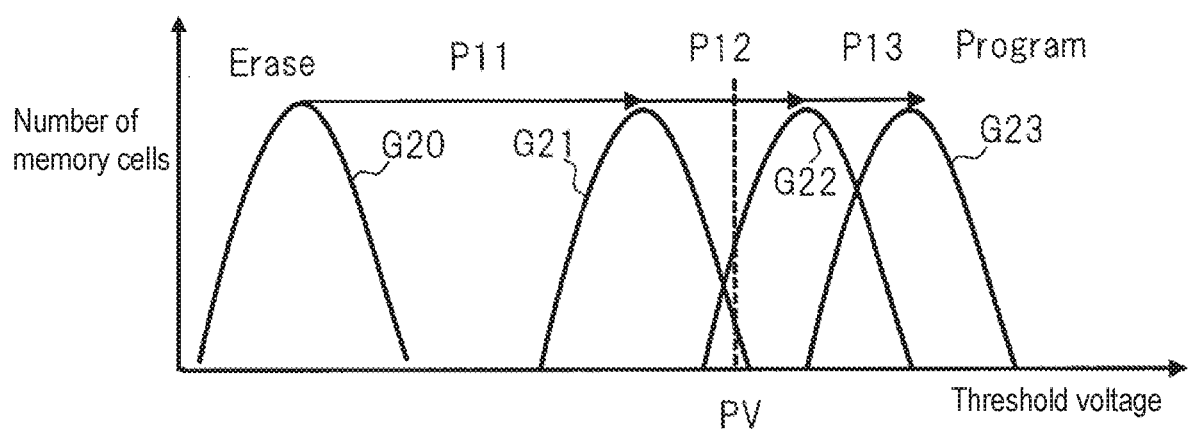
FIG. 14 is a diagram for explaining a method of obtaining an optimum write current.

Next, Embodiment 4 will be described. In this embodiment, a method for obtaining an optimum write current will be described. FIG. 14 is a diagram for explaining a method of obtaining an optimum write current. In FIG. 14, the horizontal axis represents the threshold voltage of the memory cell MC, and the vertical axis represents the number of the memory cells MC. A curve G20 in FIG. 14 shows the distribution of the threshold voltages of the memory cells MC in the erase state before the start of the write operation.

The memory controller 30 sets the threshold voltage of the memory cell MC to the final threshold voltage PV. The process of setting the threshold voltages is similar to the steps S515 and S570 described above. In addition, the memory controller 30 sets the first current value of the write current. The current value at this time is set to, for example, a writable current value at a threshold voltage smaller than the final threshold voltage PV. Specifically, the initial current value may be the initial current value described in Embodiment 3 or may be larger than the initial current value. This process is similar to, for example, the S510 of steps and the S560.

Then, the memory controller 30 applies a pulse of a write current having a first current value, e.g., P11, to the memory cells MC, and measures the threshold voltage of each memory cell. For example, the memory controller 30 measures the threshold voltage of the memory cell MC to which the pulse P11 is applied while switching the current value (or voltage value) of the reference signal REF supplied to each sense amplifier 47. In this manner, the memory controller 30 acquires the distribution of the threshold voltages of the plurality of memory cells MC in the initial current value, for example, G21.

The memory controller 30 applies pulses (e.g., P12, P13) to the memory cells MC while switching the current value of the write current a plurality of times, and acquires distributions (e.g., G22, G23) of the threshold voltages of the plurality of memory cells MC at the respective current values.

At this time, the memory controller 30 sequentially increases the current value of the write current from the current value that can be written at the threshold voltage smaller than the final threshold voltage to the current value that can be written at the threshold voltage larger than the final threshold voltage. Referring to FIG. 14, the pulse P11 is a pulse of a write current having a current value that can be written at a threshold voltage lower than the final threshold voltage. The pulses P12 and P13 are pulses of a write current having a writable current value at a threshold voltage larger than the final threshold voltage.

According to FIG. 14, when looking at the distribution G22 when the pulse P12 is applied, the minimum value of the threshold voltage is smaller than the final threshold voltage PV and is close to the final threshold voltage PV. If the write operation is performed by applying the pulse P12, the write operation to most of the memory cells MC is completed while suppressing the current consumption.

Therefore, according to FIG. 14, it is understood that the write current corresponding to the pulse P12 is the optimum write current.

In FIG. 14, the distribution of the threshold voltages when three types of pulses are applied is shown, but the distribution of the threshold voltages when more types of pulses are applied may be acquired.

According to the present embodiment, the distribution of the threshold voltage when a plurality of types of pulses having different current values are applied is obtained. According to this configuration, it is possible to obtain an optimal write current, reduce the write current, and reduce noise.

Although the configuration including a CPU 10 or the like as the in-vehicle semiconductor device has been described, for example, only the flash memory 40 and the memory controller 30 may be configured as a semiconductor memory device.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
a plurality of memory cells;
a memory controller for controlling the plurality of memory cells;
a charge pump; and
a sense amplifier provided for each of the plurality of memory cells, wherein the sense amplifier performs a determination process of whether or not a write operation to the memory cell is completed,
wherein, during a normal writing mode, the memory controller simultaneously performs, to a first number of memory cells of the plurality of memory cells, first write operations based on a first write current, and
wherein, during a high-speed writing mode, the memory controller:
simultaneously performs, to a second number of memory cells being larger than the first number of memory cells, first high-speed write operations based on a second write current, wherein a current value of the second write current is smaller than a current value of the first write current; and
when the first high-speed write operations are completed, simultaneously performs, to one or more memory cells of the plurality of memory cells to which the first write operations based on the second write current have not been completed according to determination results of the sense amplifier, second write operations based on a third write current, wherein a current value of the third write current is larger than the current value of the second write current.

2. The semiconductor device according to claim 1, wherein, in the first high-speed write operations based on the second write current, the memory controller applies a pulse of the second write current to the second number of memory cells for a first number of times.

3. The semiconductor device according to claim 2, wherein in the first high-speed write operations based on the second write current, the sense amplifier performs the determination process every time the pulse is applied to the second number of memory cells.

4. The semiconductor device according to claim 1, wherein a product of the second number of the memory cells and the current value of the second write current is equal to or less than a product of the first number of the memory cells and the current value of the first write current.

5. The semiconductor device according to claim 4,
wherein a value of the second number of the memory cells is twice a value of the first number of the memory cells, and
wherein the current value of the second write current is half the current value of the first write current.

6. The semiconductor device according to claim 1, wherein the current value of the third write current is the same as the current value of the first write current.

7. The semiconductor device according to claim 1, further comprising a switch circuit provided to each of the plurality of the memory cells,
wherein the switch circuit of the memory cell switches to indicate the necessity of the second write operation based on the determination result of the sense amplifier.

8. The semiconductor device according to claim 7, wherein the sense amplifier and the switch circuit are provided for each bit line.

9. The semiconductor device according to claim 1,
wherein a capacity of the charge pump is defined based on a current value of a write current and a number of memory cells to which write operations are to be performed simultaneously,
wherein, in a low noise write mode, the memory controller:
sets a capacity of the charge pump for the low noise write mode to be lower than a capacity of the charge pump for the normal write mode;
simultaneously performs, to a third number of memory cells being smaller than the first number of memory cells, third write operations based on a fourth write current to not exceed the set capacity of the charge pump for the low noise write mode, wherein a current value of the fourth write current is smaller than the current value of the first write current; and
when the third write operations are completed, performs, to one or more memory cells of the plurality of memory cells to which the third write operations have not been completed, fourth write operations based on a fifth write current, wherein a current value of the fifth write current is larger than the current value of the fourth write current.

10. The semiconductor device according to claim 9, wherein, in the third write operations, the memory controller applies a pulse of the fourth write current to the third number of memory cells a second number of times.

11. The semiconductor device according to claim 10, wherein the sense amplifier performs the determination process every time the pulse is applied.

12. The semiconductor device according to claim 1,
wherein, in a low-voltage write mode, the memory controller:
sets a threshold voltage of a selected number of memory cells out of the plurality of memory cells to an initial threshold voltage; and
simultaneously performs, to the selected number of memory cells, write operations based on a write current of an initial current value,
wherein, in the low-voltage write mode, when the write operations based on the write current of the initial current value to all the selected number of memory cells are determined to be completed, the memory controller sets the threshold voltage of the selected number of memory cells to a value higher than the initial threshold voltage, wherein, in the low-voltage write mode, when the write operations based on the write current of the initial current value to at least some of the selected number of memory cells are determined to not have completed, the memory controller:

increases the write current to a current value larger than the initial current value;

determines whether the threshold voltage of the write operations has reached a final threshold voltage, wherein the final threshold voltage is a voltage reached when the write operations to all the selected number of memory cell are completed;

when the threshold voltage of the write operations has not reached the final threshold voltage, sets the threshold voltage to a value higher than the initial threshold voltage; and repeats write operations based on the increased write current and the threshold voltage to the value higher than the initial threshold voltage until the write operations to all of the selected number of memory cells are completed.

13. The semiconductor device according to claim 12, wherein, in the low-voltage write mode, the memory controller sets a reference threshold voltage to the final threshold voltage, increases the current value of the write current a plurality of times, and acquires a distribution of the threshold voltages of the plurality of memory cells at the respective current values.

14. The semiconductor device according to claim 13, wherein, in the low-voltage write mode, the memory controller sequentially increases the current value of the write current from a current value writable at a threshold voltage lower than the final threshold voltage to a current value writable at a threshold voltage higher than the final threshold voltage.

15. The semiconductor device according to claim 1, wherein the semiconductor device is a nonvolatile memory.

16. The semiconductor device according to claim 15, wherein the nonvolatile memory is a flash memory.

17. The semiconductor device according to claim 1 further comprising, a CPU, wherein the memory controller is controlled by the CPU.

18. The semiconductor device according to claim 17, the semiconductor devices are in-vehicle semiconductor devices.

* * * * *